United States Patent [19]
Stork et al.

[11] Patent Number: 6,110,652
[45] Date of Patent: Aug. 29, 2000

[54] METHOD OF PRODUCING PRINTING OR EMBOSSING CYLINDERS HAVING A THREE-DIMENSIONAL PATTERNED SURFACE

[75] Inventors: Wilhelm Stork, Impflingen; Heinrich Wild, Herzogenaurach, both of Germany

[73] Assignee: Leonhard Kurz GmbH & Co., Furth, Germany

[21] Appl. No.: 09/210,097

[22] Filed: Dec. 11, 1998

Related U.S. Application Data

[63] Continuation of application No. PCT/EP97/02975, Jun. 7, 1997.

[30] Foreign Application Priority Data

Jun. 12, 1996 [DE] Germany .................. 196 23 352

[51] Int. Cl.[7] ........................................... G03F 7/24
[52] U.S. Cl. .................. 430/322; 430/323; 430/325; 430/326; 430/300; 430/307; 430/945; 101/401.1
[58] Field of Search .................... 430/322, 323, 430/325, 326, 320, 300, 306, 307, 945; 101/401.1

[56] References Cited

U.S. PATENT DOCUMENTS

| | | | |
|---|---|---|---|
| 3,694,080 | 9/1972 | Malsky | 355/86 |
| 5,247,883 | 9/1993 | Kuwahara et al. | 101/170 |
| 5,291,317 | 3/1994 | Newswanger | 359/15 |

FOREIGN PATENT DOCUMENTS

| | | |
|---|---|---|
| 0 072 609 | 2/1983 | European Pat. Off. . |
| 0 692 741 A1 | 1/1996 | European Pat. Off. . |
| 43 13 111 A1 | 10/1994 | Germany . |

*Primary Examiner*—John A. McPherson
*Attorney, Agent, or Firm*—Akin, Gump, Strauss, Hauer & Feld, L.L.P.

[57] ABSTRACT

In a method of three-dimensionally patterning the surface of a printing or embossing cylinder the surface of the cylinder is irradiated with exposure beams in accordance with the desired pattern and then the surface is patterned in accordance with the exposure. To achieve particularly fine structuring of the cylinder surface, the radiation dots serving to expose the surface are produced by means of beams which, before impinging on the surface of the cylinder, to form fine structures, are modified in accordance with the desired pattern by means of a beam-forming element. The pattern of the respective radiation dot which is impinged on to the cylinder surface is moved synchronously with respect to the movement of the cylinder surface in accordance with the rotary movement thereof.

24 Claims, 2 Drawing Sheets

METHOD OF PRODUCING PRINTING OR EMBOSSING CYLINDERS HAVING A THREE-DIMENSIONAL PATTERNED SURFACE

This application is a continuation of Application Ser. No. PCT/EP97/02975, filed Jun. 7, 1997, published as WO 97/48022 on Dec. 18, 1997.

BACKGROUND OF THE INVENTION

The invention concerns a method of producing cylinders such as printing or embossing cylinders having a three-dimensionally patterned surface, by means of a lithographic method.

In this specification the term cylinder is used to include a printing cylinder, an embossing cylinder or like cylinder which is to have a three-dimensional pattern at its surface.

In one form of method of producing a cylinder with a three-dimensionally patterned surface, a radiation-sensitive layer forming the surface of the cylinder is irradiated progressively in dot-wise manner in accordance with the desired pattern by means of an exposure beam which is imaged or projected on to the layer. The layer is ablated or removed in region-wise manner and thereby the surface of the cylinder is patterned.

It is known for the surface of printing cylinders to be patterned by means of a procedure referred to as laser lithography. In that operation a metal cylinder coated with photoresist is exposed by means of a laser in dot-wise manner in accordance with the desired pattern. After the exposure operation the photoresist is washed off at the exposed locations in a chemical developer bath. The metal forming the surface of the printing cylinder is then bare at the washed-off locations. That metal is then exposed to suitable chemicals, in particular acids, in order to etch a suitable pattern, for example a print image, into the surface of the cylinder. In that method dot sizes of between about 5 and 50 $\mu$m are used. With those dot sizes the operation of exposing the entire surface of a roller which is about 1 meter in length and 1 meter in periphery lasts for between about 1 and 2 hours. If it is assumed that the raster dot size of 15 $\mu$m which is usually employed is used, then by calculation that gives an exposure frequency of between 500 kHz and 1 MHz which can be produced for example by means of acousto-optical modulators which are connected in the form of optical switches into the beam path of the exposure beam. If that method involves using a UV-laser with a wavelength of about 350 nm, a laser power at the focus of about 1 W is required, in which respect the printing cylinder can rotate at up to 1600 rpm during the exposure operation.

The above-outlined method can readily be used for structuring the surface of printing cylinders where structures of an order of magnitude of between 5 and 50 $\mu$m are absolutely sufficient to achieve a suitable quality of image. For certain areas of use however, for example for producing surface structures which are operative by a diffraction or interference-optical effect, as are used for example for decorative or security purposes, substantially finer structures are required. For example, in the case of relief structures for security elements which vary their appearance, for example undergo a change in color, in dependence on the variation in the illumination and/or viewing angle, use is made of grating structures in which the grating constant is markedly less than 1 $\mu$m. In order to be able to produce such fine structures, it would be necessary in the case of the above-discussed method to operate with dot sizes of less than 0.5 $\mu$m. In order to be able to operate with such small dot sizes, it would be necessary on the one hand to position the exposure beam with the utmost degree of accuracy, which is not possible with this system and which would at any event involve a very high level of apparatus expenditure because of the extremely accurate synchronisation that would possibly be required in terms of the exposure frequency and the frequency of rotation of the cylinder. In addition, the exposure times would be shortened by a factor of between 100 and 1000 per dot with a total exposure time remaining the same, and that also could only be embodied using extremely expensive measures. Accordingly, with normal exposure times for the individual dot, the total exposure time would be increased by a factor of between 100 and 1000. In both cases the exposure method would become very expensive and thus uneconomical.

It is already known from U.S. Pat. No 5,291,317 to produce fine structures, in particular holographic grating structures which comprise a plurality of picture dots or pixels, by a procedure whereby, upon irradiation of a substrate, the individual pixels are already finely structured in themselves by using a beam-forming element. In that method however the substrate is precisely adjusted prior to any irradiation operation, that is to say to produce each pixel, and is absolutely not moved during the irradiation procedure. That mode of operation is not possible when structuring printing cylinders as the respective mass to be accelerated would be excessively great. If however the cylinder is not stopped during the exposure operation, the usual surface speeds at speeds of rotation of around 1000 rpm and with a usual exposure time of about 1 usec result in lack of sharpness and definition of the imaged or projected beam, and under some circumstances that lack of sharpness and definition is greater than the degree of fineness of the structures, for example the spacing of grating lines forming the structure. It seems therefore that the method in accordance with U.S. Pat. No 5,291,317 cannot be used for producing surface patterning comprising individual, finely structured pixels on a rotating cylinder.

BRIEF SUMMARY OF THE INVENTION

An object of the present invention is to provide a method of producing a cylinder having a three-dimensionally patterned surface, which makes it possible, with exposure times which can be satisfactorily implemented and with sufficiently accurate positioning of radiation dots for producing the desired structure, nonetheless to produce structures which are substantially finer than the hitherto conventional structures, at the cylinder surface.

Another object of the present invention is to provide a method of producing a three-dimensionally patterned surface structure on a printing or embossing cylinder or the like, the structure being adapted to afford suitable light-diffraction, interference or reflection effects.

Another object of the present invention is to provide a way of making it possible to pattern the surface of a continuously moving cylinder with a plurality of picture dots or pixels which are very finely structured in themselves, wherein operation can be implemented with normal, hitherto conventional exposure times and consequently with radiation sources of a power output of normal magnitude.

In accordance with the invention the foregoing and other objects are attained by a method of producing a printing or embossing cylinder with a three-dimensionally patterned surface, by a lithographic procedure, in which a radiation-sensitive layer forming the cylinder surface is progressively irradiated dot-wise in accordance with the desired pattern by an exposure beam, and the layer is removed or ablated in region-wise manner, thereby to pattern the cylinder surface. The radiation dots are produced by means of beams which are modified before impinging on the surface of the cylinder by means of a beam-forming element in accordance with the desired pattern to form fine structures within the respective radiation dot and are then projected or imaged on to the cylinder surface. In addition the pattern of the respective radiation dot, which is imaged or projected on to the cylinder surface, is moved synchronously with the movement of the cylinder surface in accordance with the rotation thereof.

Contrary to the requirement in accordance with U.S. Pat. No. 5,291,317 whereby the substrate must be precisely set prior 35 to each exposure operation and must stand still during the exposure operation, the method according to the invention makes it possible for the cylinder such as a printing cylinder to continuously rotate. Nonetheless, the movement of the pattern of the respective picture dot or pixel, which forms the structure on the cylinder surface, such movement being synchronous with respect to the movement of the surface of the cylinder, that is to say in the same direction and at the same speed, provides that the pattern appears stationary during the exposure operation with respect to the surface of the cylinder. That makes it possible to operate with dots or pixels of the usual diameter of between about 10 and 20 $\mu$m, without involving troublesome lack of sharpness and definition. If in contrast such a 'tracking adjustment effect' were not to be implemented, that would result in lack of sharpness and definition in the image produced, which at any event would be markedly greater than 1 $\mu$m, that is to say it would be greater than the spacing of the grating lines of a grating designed for visible light. With a picture dot or pixel diameter of between 10 and 20 $\mu$m however it is also possible to use the usual exposure frequencies, laser output power levels and exposure times, and for that reason existing systems only have to be slightly modified.

There is a large number of options in regard to the beam-forming element. When dealing with a plurality of surface structures however it is desirable if the beam-forming element used is in the form of a beam-diffracting element, wherein the beam-diffracting element is desirably a diffraction grating or an element which acts in a corresponding manner to a diffraction grating.

If, as is provided in accordance with a preferred feature of the invention, the beam-forming element used is one whose structure produces a phase shift within the beam to be formed and thereby produces an interference pattern, that can achieve the substantial advantage that the depth of field or sharpness can be enlarged considerably, for example and more specifically by a factor of 4, in comparison with a conventional imaging procedure. In that case, the beam-forming element used is desirably a phase Ronchi structure. The term phase Ronchi structure, for example a phase Ronchi grating, is used to denote a structure with a surface relief of rectangular shape, wherein usually the width of the depression or recess and the adjacent raised portion or land (in the case of gratings) is equal. The thickness of phase Ronchi gratings or structures is so selected that the local phase delay between raised portion or land and adjacent recess precisely corresponds to 180°. In that case operation can be effected both in the transmission mode and in the reflection mode. Linear phase Ronchi structures are required for producing for example line gratings. For cross- or quadruple-beam splitters a corresponding chessboard relief is required. Beam-forming elements of that kind make it possible to produce interference patterns at the focus of an exposure apparatus, for which, in comparison with a conventional imaging operation, only half the numerical aperture is required, which means that when using elements of that kind as beam-forming elements, the depth of field or sharpness which in fact is related to the square of the aperture, can be enlarged by the factor of 4. For example, in the case of a grating with a grating constant of 0.7 $\mu$m and when using light of a wavelength of 350 nm, it is possible to achieve a depth of sharpness of at least 6 $\mu$m, in which respect simulation calculations have shown that in that case it is even possible to attain a depth of sharpness of at least ±5 $\mu$m. That depth of sharpness of about 10 $\mu$m represents a considerable advantage because that makes it possible to considerably simplify focusing on to the surface of the cylinder to be processed.

If in accordance with a preferred feature acousto-optical transducers are used as the beam-forming elements, it is possible in the same manner to achieve an improvement in the sense of an increased depth of sharpness as when using phase Ronchi structures, as beam formation can be effected with acousto-optical transducers in the Bragg operating system, as when using phase Ronchi structures.

The synchronous movement of the pattern of the picture dots or pixels can be implemented in various ways. For example, it is provided that the beam-forming element, for producing a movement of the imaged or projected beam forming the respective radiation dot, is moved synchronously with respect to the movement of the cylinder surface. In particular the beam-forming element can rotate synchronously with the rotary movement of the cylinder. The movement of the imaged or projected beam overall can be effected for example by means of galvanometer mirrors, rotating polygonal mirrors or also with acousto-optical deflectors. In this connection, the beam would generally have to perform a sawtooth-like movement, more specifically a comparatively slow movement in the direction of movement of the cylinder surface and a very fast return movement in the opposite direction. The angular range to be covered by the beam can be kept small, in accordance with the frequency of the zig-zag movement. This is also necessary for the reason of maintaining the respectively applicable range of depth of sharpness.

It may also be desirable if the beam-forming element used is one whose beam-forming properties are variable, in which case an acousto-optical transducer is desirably used as a beam-forming element of that kind. In that respect the use of a beam-forming element with variable properties affords a number of advantages. On the one hand, when using a beam-forming element of that kind, this affords the possibility of varying the structure of the individual radiation dots from one dot to another or from one group of dots to another, and in that way varying the surface structure of the printing cylinder at comparatively low cost.

In particular, in accordance with the invention however it is not only when using an acousto-optical transducer as the beam-forming element, that there is the possibility of the beam-forming element being operated and controlled in such a way that it produces a movement of the pattern which occurs synchronously with respect to the rotary movement of the cylinder surface, whereby the desired virtually stationary arrangement of the radiation dots on the surface of the printing cylinder can be achieved in a very simple fashion.

If the surface of the cylinder, to produce the desired pattern, is irradiated by means of the radiation dots in a line-wise manner, it is then generally possible to achieve a really neat and clean, regular structuring effect. For the majority of situations of use however it is more desirable if, as a preferred feature of the invention further provides, the surface of the cylinder is irradiated in a helical configuration in the radiation dots, to produce the desired pattern, in which case it is then possible to achieve virtually absolutely seam-free structuring of the surface of the cylinder. It will be appreciated that it is also possible to adopt the line-wise and helical arrangement in a suitable combination.

Particularly when implementing helical irradiation of the cylinder surface, the procedure adopted is advantageously such that the radiation dots in adjacent lines or helical lines are arranged in slightly displaced relationship with each other. This has the advantage that certain irregularities in terms of positioning of the radiation dots do not cause problems and disturbances, because adjacent radiation dots are not precisely aligned with each other, virtually from the outset. As the radiation dots are in fact only very small and are thus clearly below the resolution capability of a human eye, those irregularities are not registered by the viewer, which however then means that further irregularities in positioning are also not apparent, with consequential disturbance.

In general, in the case of the method according to the invention, in a preferred feature, the operating procedure should be such that mutually adjacent radiation dots are arranged in displaced relationship with each other by a dimension which is less than the resolution capability of the naked eye, with respect to a reference or target position corresponding to the regular arrangement of the radiation dots, wherein the displacement of the radiation dots is provided in a statistically irregular fashion over a relatively large surface portion of the cylinder which has a plurality of radiation dots. Desirably in this case all radiation dots are arranged in such a way that the pattern respectively corresponding thereto is displaced with respect to the reference or target position, being the central arrangement of the pattern of the individual radiation dots. If operation is implemented in that way, a viewer is absolutely no longer capable of detecting minor inaccuracies in regard to the patterning effect. On the contrary, the entire image involves a very slight degree of lack of sharpness or definition, which reliably covers over any irregularities in terms of positioning of the individual radiation dots.

Very versatile patterning of the printing cylinder can be achieved when, in accordance with a further preferred feature of the invention, different patterns are associated with different radiation dots, which can be easily effected in particular when using a beam-forming element whose beam-forming properties can be varied.

The most widely varying kinds of beam-forming elements can be used. If for example the cylinder surface is to have a grating structure, the beam-forming element used may be in the form of an element which already implements a corresponding splitting effect in respect of the light in the exposure beam, the splitting effect leading to the production of a grating on the surface of the cylinder. For example, a grating can be produced on the surface of the cylinder by a procedure whereby the beam-forming element, by diffraction, produces light beams of different diffraction orders, of which then two are united at the focus, that is to say on the surface of the cylinder, and by interference produce a corresponding strip structure at the surface of the cylinder. A suitable grating could be for example the phase Ronchi grating already referred to hereinbefore.

Beam-forming elements whose beam-forming properties are variable may be implemented in different ways. For example it is possible to use structures which are moved mechanically. If the procedure for example involves achieving a movement of the pattern produced by interference, at the focus, it is possible to use a correspondingly moved beam splitter grating. It would be possible for example to use a star grating in the form of a phase Ronchi grating, with radial arms, in which, in the outer region, the grating lines extend almost parallel in the case of a small light beam diameter, and which correspondingly rotates about a central axis. When the beam is caused to pass through the star grating outside the center, splitting is effected, with a frequency shift which is proportional to the speed of rotation. In the case of diffraction at the rotating phase grating, the light frequency of the diffraction orders which are diffracted in the direction of movement is increased by the Doppler frequency while the light frequencies of the orders which are diffracted in opposite relationship to the direction of movement are reduced by the Doppler frequency. When those beams are united at the focus, the phase of the positively shifted beam portion then leads the phase of the negatively shifted beam portion, thereby achieving a movement of the interference pattern at the focus. As a differential frequency at the level of double the Doppler frequency is afforded as a result of the interference of Doppler-shifted beams which were each shifted by the same amount but in different directions, the speed of movement of the rotating grating only has to correspond to half the speed of movement of the cylinder in order to achieve an exact tracking effect.

Both the variation in the structure of the pattern and also in particular the movement thereof can be effected by widely varying kinds of acousto-optical transducers or modulators.

Usually, in the case of an acousto-optical transducer, the acousto-optical effect is produced by coupling sound waves into a crystal such as $TeO_2$ or other material. The propagating sound wave produces a periodic fluctuation in density in the crystal, and that results in a periodic variation in the refractive index. If light is passed through the acoustically excited crystal, then the light is diffracted in accordance with the periodic fluctuations in density, which has the result that the image produced by interference and corresponding imaging varies in accordance with the variation in the refractive index thereof in the various regions of the acousto-optical transducer (in regard to the design of acousto-optical transducers, attention is directed for example to the book 'Optical Waves in Crystals' by Yariv and Yeh, Chapters 9 and 10 (pages 318 ff), J Wiley & Sons, 1984).

Desirably, the acousto-optical transducers used are those which are sufficiently thick to be capable of being operated in the Bragg state. If a cell of that kind is irradiated at the Bragg angle, a high level of diffraction efficiency is achieved due to the volume diffraction effect, and in general only two outgoing beams are produced, namely the passing beam of the zero diffraction order and the diffracted beam of the 1st diffraction order, which then meet as beams at the focus when the frequency of the two beams interfere with each other there and form a fine interference pattern. If operation is implemented with a beam-forming element in the form of phase Ronchi structures (in which case then only mechanical movement would be possible), the beam will advantageously be guided and passed in such a way that the −1st and the +1st diffraction order are used in each case. If a phase Ronchi grating of the correct depth is used, no zero diffraction order is involved. In that case the two 1st orders receive about 80% of the irradiated energy. The higher orders have together only 20%, which generally have such a high deflection angle that they no longer pass through the optical illumination system so that in general there is no need to use an extra aperture or screening means to cut out the higher diffraction orders.

Instead of a Bragg cell it would also be possible to use so-called SAW cells (Surface Acoustic Waves) which are thinner and produce sinusoidal surface distortions and thus a travelling surface structure, which generally results in many diffraction orders (similarly to a thin Bragg cell which operates in the Raman-Nath domain). In that case higher diffraction orders have to be faded out according to the respective pattern wanted.

A more complicated movement of the pattern could also be achieved under some circumstances by using acousto-optical transducers which are capable of producing a variation in the optical properties of the cell not only in one direction which can be defined as the X-direction but also in the direction perpendicular thereto which can be defined as the Y-direction. When using acousto-optical transducers of that kind, it would also be possible not to move the pattern in itself but the entire spot which is projected or imaged on to the surface of the cylinder.

Apart from the material constituting the radiation-sensitive layer on the surface of the cylinder, it is possible to operate with the most widely varying exposure systems. For example it would be possible to use as the exposure beams X-ray or electron beams which are comparatively energy-rich. In accordance with the invention however the procedure involved will preferably be such that the radiation-sensitive layer on the cylinder is a photosensitive layer which is exposed by means of light radiation, in which case laser radiation is desirably used to irradiate the surface of the cylinder as laser radiation can be very cleanly focussed and has a correspondingly high energy content in order to guarantee a clean and neat, correspondingly finely structured exposure effect for the photosensitive layer on the surface of the cylinder.

Further objects, features and advantages of the invention will be apparent from the following description of a preferred embodiment of the method according to the invention.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiment(s) which are presently preferred. It should be understood, however, that the invention is not limited to the precise arrangements and instrumentalities shown. In the drawings.

DETAILED DESCRIPTION OF THE INVENTION

Figure 1:
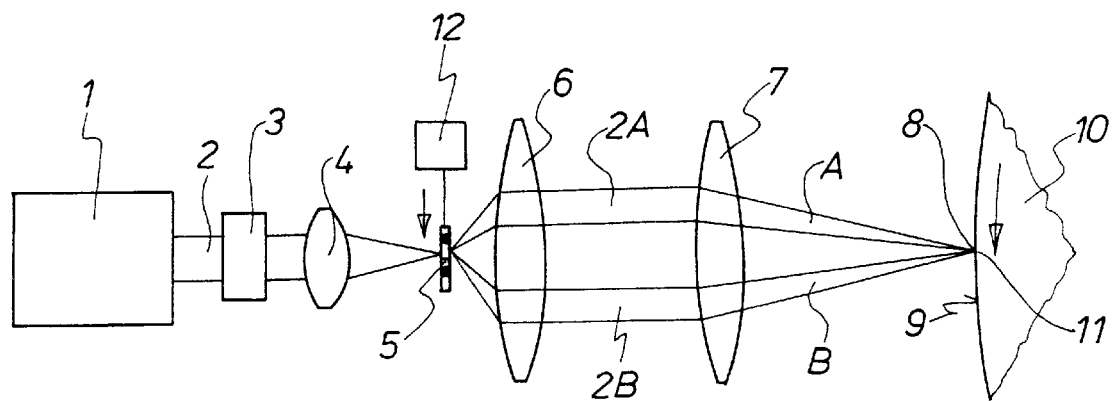
FIG. 1 diagrammatically shows an arrangement for carrying out the method according to the invention, FIG. 2 diagrammatically shows the beam path in the region of the focus when producing a grating structure by the interference of two beams, FIG. 3 diagrammatically shows two possible ways of dot-wise exposure of the surface of a printing cylinder, FIG. 4 diagrammatically shows a portion from a surface of a printing cylinder.

Referring to FIG. 1 shown therein is an arrangement as can be used when carrying out the method in accordance with the invention. In the case of the illustrated embodiment, it is assumed that operation is effected with laser radiation and that a suitable photoresist layer on the surface of the cylinder is to be progressively irradiated thereby in dot-wise manner, by the generation of radiation dots.

For that purpose the arrangement illustrated in FIG. 1 includes a laser 1, for example a UV-laser, which operates with a wavelength of about 350 nm and has an output power of about 1 W. The laser beam 2 issuing from the laser 1 passes through an acousto-optical modulator 3 which essentially has only the function of an optical switch, namely it involves the task of switching the laser beam 2 on and off in accordance with the desired exposure cycle frequency. A lens 4 produces on a beam-forming element 5, for example a beam splitter grating, an illumination dot of a predetermined desired size.

Figure 2:
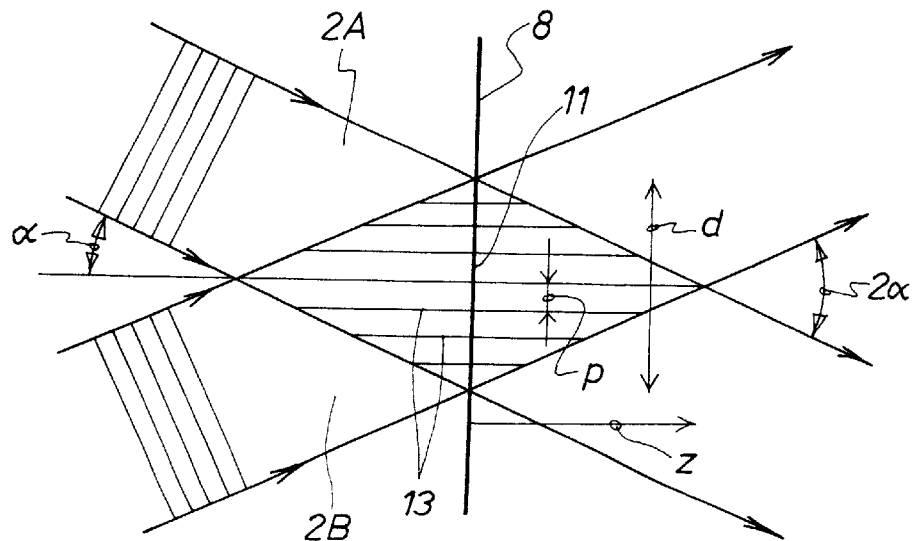

By diffraction, the beam-forming element 5 provides for splitting of the beam into a plurality of beams, in which respect in accordance with the illustrated embodiment it will be assumed that the beam-forming element 5 produces from the beam 2 two beam portions 2A and 2B, for example the diffraction beams of the +1st and −1st orders. Those beams 2A and 2B are united again by the optical system comprising the lenses 6 and 7, as illustrated in FIG. 2; in that case, radiation dots 11 with a corresponding interference pattern, for example a grating structure, are formed at the focus 8 on the surface 9 of the printing cylinder 10, on which the photoresist layer is provided. In this respect the form of the interference pattern depends on the nature and configuration of the beam-forming element 5, for example the beam splitter grating.

Finally it will also be seen from FIG. 1 that the beam-forming element 5 is connected to a control device 12, which is intended to indicate that the beam-forming element 5 is an element which, for example in dependence on suitable synchronisation signals to the control device 12, is movable or is variable in respect of its optical properties, so that in that way the pattern or the position of the structures in the radiation dots 11 can be altered or the radiation dots 11 can be moved over the surface 9 of the cylinder 10 synchronously with respect to the movement thereof.

The beam-forming element 5 may desirably be formed by an acousto-optical transducer of suitable structure, which for example affords the possibility of causing a certain grating structure to run, with suitable actuation and control of the beam-forming element 5, synchronously with respect to the rotary movement of the printing cylinder 10, along the plane of the beam-forming element 5, for example in the direction of the arrows in FIG. 1.

FIG. 2 diagrammatically indicates how a radiation point 11 with a structure as indicated by the grating lines 13 can be produced at the focus 8 on the surface 9 of the cylinder 10.

For that purpose the two light beam portions 2A and 2B which are produced by diffraction by the beam-forming element 5, for example a beam splitter grating, and which involve a corresponding phase shift, are superimposed at the focus 8, thereby producing an interference structure in the form of the grating strips 13.

The period p of the grating strips 13 at the focus 8 can be determined in this respect in accordance with the following formula:

$$p = \lambda : [2 \cdot \sin \alpha]$$

If for example with a wavelength of 350 nm in respect of the laser used, it is assumed that the period p of the grating structure at the radiation dot 11 is to be 0.7 μm, then in consideration of the foregoing formula the value of α is an angle of about 15° or a numerical aperture sin α of 0.25.

It is further important for operation to be implemented with a sufficient depth of field or sharpness in order to compensate for certain irregularities in diameter or concentricity or rotary truth of the cylinder to be patterned.

If in that situation it is assumed that the diameter d of the radiation dot or dots is 15 μm, then, having regard to the aperture of 0.25, calculation affords an approximate depth of field or sharpness z of at least ±5 μm, which is usually sufficient to bridge over any tolerances that there may be.

The surface 9 of the cylinder 10 is now progressively exposed in a dot-wise manner by the radiation dots being caused to impinge on the surface 9, that is to say the image of one radiation dot 11 after the other is formed on the surface 9 of the cylinder 10 or one radiation dot 11 after the other is projected on to the surface 9, with the individual radiation dots 11 already being suitably structured.

After the exposure operation the appropriately photosensitive layer on the surface 9 of the cylinder 10 is possibly treated in order then to be able to remove the surface layer entirely in the non-exposed regions and in a manner corresponding to the desired structure in the exposed regions, for example by a dissolution procedure. That is then followed by the operation of etching the surface 9 of the cylinder 10 in the usual manner in order to structure the actual surface of the cylinder.

It will be appreciated that it is not only possible to operate with laser light in accordance with the embodiment described with reference to FIG. 1. When using suitable coatings on the surface 9 of the cylinder 10, it is also possible to use other kinds of exposure beams, for example X-ray or electron beams, whereby a further refinement in the structure can possibly be achieved. It is also the case that the method in accordance with the invention can basically be used not only when the situation involves removing or ablating regions of the surface of the cylinder. It would also be possible to envisage ways of carrying the method into effect, in which material is applied to the surface 9 of the cylinder in dependence on the corresponding irradiation effect, for example by transfer of a layer which bears against the surface 9 of the cylinder 10.

Progressive patterning of the surface 9 of the cylinder 10 with radiation dots 11 can be effected in various ways.

Figure 3:
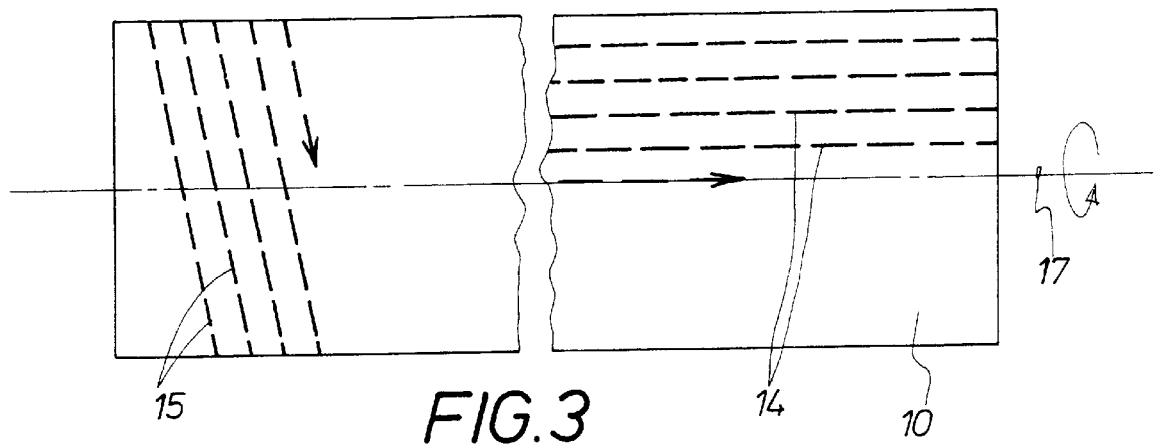

For example, as diagrammatically illustrated in FIG. 3 at the right thereof, it is possible to provide the radiation dots in straight lines along the dashed lines indicated at 14, with one line 14 after the other being 'written'.

In particular having regard to the inaccuracies which possibly occur and in order to shorten the processing time however it will be desirable to pattern the printing cylinder 10 in the manner diagrammatically indicated at the left in FIG. 3, in other words, the radiation dots 11 are arranged along helical lines 15; in the illustrated embodiment, it is assumed that the helical lines 15 are additionally also interleaved with each other.

In principle it is possible, when structuring the surfaces 9 of cylinders 10 in accordance with the invention, to operate in such a way that all radiation dots 11 are of the same structure and a distinction is only made between regions with radiation dots 11 and regions 16 in which no irradiation effect occurred, that is to say where the surface 9 of the cylinder 10 remains unchanged.

Figure 4:
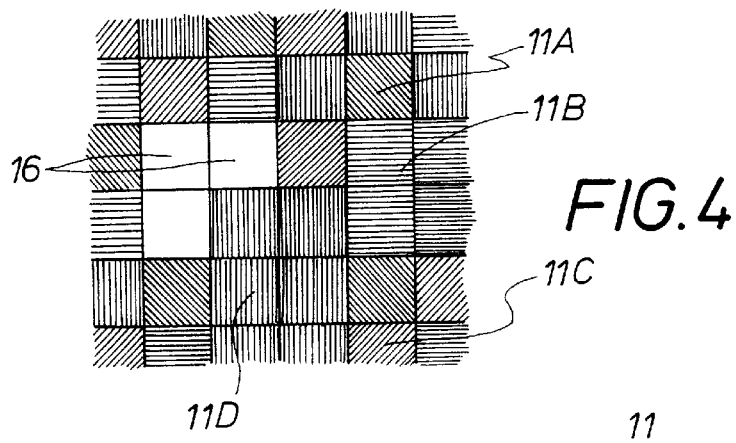

FIG. 4 however indicates that the structuring of the surface 9 of the cylinder 10 can be still more varied if the individual radiation dots 11A, 11B, 11C and 11D each involve a structure which is different in itself, as is indicated in FIG. 4 by the nature of the hatching therein; in this respect, all directly adjacent radiation dots 11 may be respectively differently structured, but there is also the possibility of structuring larger regions in identical fashion, by radiation dots (for example 11B, 11D in FIG. 4) involving the same patterning being disposed in side-by-side relationship.

As, with the degree of fineness of the pattern produced in accordance with the invention, it is not possible to replace the beam-forming element 5 from one radiation dot to another, the procedure involved here is advantageously such that use is made of beam-forming elements 5 whose structure or the structure produced by which is variable by way of the control device 12. Here there are suitable acousto-optical transducers which for example can vary the period of the grating produced. It is however also possible, when using suitable transducers and with suitable actuation control, to produce a rotary movement or a distortion of the pattern produced by the transducer 5, and in that way vary the pattern of various radiation dots 11.

Figure 5:
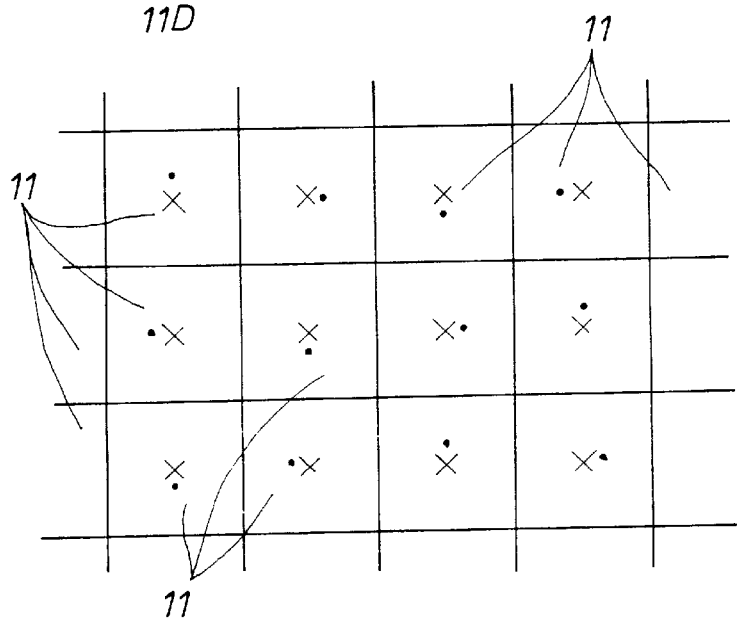
FIG. 5 is a diagrammatic view to describe the mutual displacement of the radiation dots.

Finally FIG. 5 indicates that it may be highly desirable for the pattern of adjacent radiation dots 11 to be displaced from one radiation dot to another, in relation to the actual centers of the individual radiation dots 11, as indicated by an x in FIG. 5, wherein the actual center point of the pattern present in each respective radiation dot 11 is indicated in FIG. 5 by a small point.

This intentional displacement of the pattern of adjacent radiation dots 11 with respect t6 their center x results in a certain lack of sharpness and definition of the entire image produced on the surface 9 of the cylinder 10 by the radiation dots 11, thereby providing that inaccuracies which possibly occur in manufacture are not visible to the normal viewer. That is necessary because the applicants' experiments have shown that for example regular displacements of grating structures relative to each other are already perceived by a viewer if those displacements are substantially less than a dimension which corresponds to the normal resolution capability of the human eye.

FIG. 5 also shows that the displacement of the pattern with respect to the center x of a radiation dot 11 is effected in different ways in each of all the mutually adjacent radiation dots, which is important to avoid producing an optically disturbing effect by virtue of multiple uniform displacement of the pattern in adjacent radiation dots.

Displacement of the pattern of the radiation dots 11 with respect to each respective center x can also be attained by appropriate actuation and control of suitable transducers 5.

It will be appreciated that the above-described method in accordance with the invention has been set forth solely by way of example and illustration of the principles thereof and that various other modifications and alterations may be made therein without thereby departing from the scope and spirit of the invention.

What is claimed is:

1. A method of producing a cylinder with a three-dimensionally patterned surface by means of a lithographic method, wherein a radiation-sensitive layer at a surface of a cylinder is irradiated progressively in dot-wise manner in accordance with a desired pattern by means of beam-induced exposure, wherein the radiation dots irradiating the surface layer are produced by means of beams which are modified before impinging on the surface of the cylinder by means of a beam-forming element in accordance with the desired pattern to form fine structures within the respective radiation dot and are then caused to impinge on to the cylinder surface, wherein the pattern of the respective radiation dot which is caused to impinge on to the cylinder surface is moved synchronously with a movement of the cylinder surface in accordance with a rotation thereof, and wherein the surface layer is removed in region-wise manner thereby to produce said surface patterning.

2. A method as set forth in claim 1 wherein the beam-forming element is a beam-diffracting element.

3. A method as set forth in claim 2 wherein the beam-forming element is a diffraction grating.

4. A method as set forth in claim 2 wherein the beam-forming element is an element acting in a manner corresponding to a diffraction grating.

5. A method as set forth in claim 1 wherein the beam-forming element comprises a structure adapted to produce a phase shift within the beam to be formed and thereby produce an interference pattern.

6. A method as set forth in claim 5 wherein a phase Ronchi structure is used as the beam-forming element.

7. A method as set forth in claim 1 wherein the beam-forming element, to produce a movement of the beam forming the respective radiation dot, is moved synchronously with respect to the movement of the cylinder surface.

8. A method as set forth in claim 1 wherein the beam-forming element has variable beam-forming properties.

9. A method as set forth in claim 8 wherein an acousto-optical transducer is used as the beam-forming element.

10. A method as set forth in claim 8 wherein the beam-forming element is actuated in such a way that it produces a movement of the pattern, which takes place synchronously with respect to the rotary movement of the cylinder surface.

11. A method as set forth in claim 1 wherein the surface of the cylinder, to produce the desired pattern, is irradiated by means of the radiation dots in line-wise manner.

12. A method as set forth in claim 11 wherein the radiation dots in adjacent lines are arranged in slightly displaced relationship with respect to each other.

13. A method as set forth in claim 1 wherein the surface of the cylinder, to produce the desired pattern, is irradiated by means of the radiation dots helically.

14. A method as set forth in claim 13 wherein the radiation dots in adjacent helical lines are arranged in slightly displaced relationship with respect to each other.

15. A method as set forth in claim 1 wherein mutually adjacent radiation dots are arranged in displaced relationship with each other by a dimension which is less than a resolution capability of the naked eye with respect to a reference position corresponding to a regular arrangement of the radiation dots, and wherein the displacement of the radiation dots is provided in a statistically irregular manner over a relatively large surface portion of the cylinder which has a plurality of radiation dots.

16. A method as set forth in claim 15 wherein all radiation dots are arranged in such a way that the pattern respectively corresponding thereto is displaced with respect to the reference position as the central arrangement of the pattern of the individual radiation dots.

17. A method as set forth in claim 1 wherein different patterns are associated with different radiation dots.

18. A method as set forth in claim 1 wherein the radiation-sensitive layer on the cylinder is a photosensitive layer which is exposed by means of light radiation.

19. A method as set forth in claim 1 wherein laser radiation is used for irradiation of the cylinder surface.

20. A method as set forth in claim 1 wherein the beams are projected on to the surface layer on the cylinder.

21. A method as set forth in claim 1 wherein the beams are imaged on to the surface layer on the cylinder.

22. A method of producing a cylinder with a three-dimensionally patterned surface by means of a lithographic method, wherein a radiation-sensitive layer at a surface of a cylinder is irradiated progressively in dot-wise manner in accordance with a desired surface pattern by means of beam exposure, wherein the radiation dots irradiating the layer are produced by means of beams which are modified before impinging on the layer at the surface of the cylinder by means of a beam-forming element in accordance with the desired pattern to form fine structures within the respective radiation dot and are then impinged on to the layer at the cylinder surface, and wherein the pattern of the respective radiation dot is moved synchronously with a movement of the cylinder in accordance with a rotation thereof, whereby the layer is effective to furnish said surface patterning on the cylinder.

23. A method of applying a three-dimensional patterning structure to the surface of a cylinder, the surface being formed by a radiation-sensitive layer, wherein a surface of a cylinder is irradiated progressively in dot-wise manner in accordance with a desired pattern by means of beam-induced exposure, wherein the radiation dots irradiating the surface layer are produced by means of beams which are modified before impinging on the surface of the cylinder by means of a beam-forming element in accordance with the desired pattern to form fine structures within the respective radiation dot and are then caused to impinge on to the cylinder surface, wherein the pattern of the respective radiation dot which is caused to impinge on to the cylinder surface is moved synchronously with the movement of the cylinder surface in accordance with the cylinder rotation, and wherein said layer is removed in a region-wise manner thereby to produce the patterning structure on said surface.

24. A method as set forth in claim 23 wherein the layer is removed by ablation.

* * * * *